United States Patent [19]

Sher

[11] Patent Number: 4,697,202

[45] Date of Patent: Sep. 29, 1987

[54] INTEGRATED CIRCUIT HAVING DISLOCATION FREE SUBSTRATE

[75] Inventor: Arden Sher, Belmont, Calif.

[73] Assignee: SRI International, Menlo, Calif.

[21] Appl. No.: 576,728

[22] Filed: Feb. 2, 1984

[51] Int. Cl.[4] .................. H01L 29/167; H01L 29/207; H01L 29/227

[52] U.S. Cl. ........................................ 357/63; 357/61; 357/16; 357/41; 357/43; 357/23.2; 437/165

[58] Field of Search ................... 357/61, 63, 16, 41, 357/23.1, 23.2, 31, 43; 148/DIG. 67, DIG. 72, 175

[56] References Cited

U.S. PATENT DOCUMENTS

| | | | |
|---|---|---|---|
| 2,032,439 | 3/1936 | Ruben | 357/61 |
| 2,600,997 | 6/1952 | Lark-Horovitz et al. | 357/61 |
| 2,801,376 | 7/1957 | Lark-Horovitz et al. | 357/61 |
| 3,147,412 | 9/1964 | Hill | 357/61 |
| 3,218,203 | 11/1965 | Ruehrwein | 148/DIG. 67 |
| 3,218,204 | 11/1965 | Ruehrwein | 148/DIG. 72 |
| 3,224,913 | 12/1965 | Ruehrwein | 148/175 |
| 3,261,726 | 7/1966 | Ruehrwein | 148/33.4 |
| 3,322,575 | 5/1967 | Ruehrwein | 357/16 X |
| 3,454,370 | 7/1969 | Castellion | 357/61 X |
| 3,617,820 | 11/1971 | Herzog | 357/61 |
| 3,629,018 | 12/1971 | Henderson | 148/187 |
| 3,721,583 | 3/1979 | Blakeslee | 357/16 X |
| 3,821,033 | 6/1974 | Hu | 148/175 |
| 3,862,859 | 1/1975 | Ettenberg et al. | 117/215 |
| 3,947,840 | 3/1976 | Craford et al. | 357/45 X |
| 3,963,538 | 6/1976 | Broadie et al. | 357/16 X |
| 3,963,539 | 6/1976 | Kemlage et al. | 357/16 X |
| 3,978,360 | 8/1976 | Fletcher et al. | 357/63 |
| 4,019,082 | 4/1977 | Olson et al. | 357/30 X |
| 4,088,515 | 5/1978 | Blakeslee et al. | 357/16 X |
| 4,115,164 | 9/1978 | Jager et al. | 357/16 X |
| 4,116,733 | 9/1978 | Olson et al. | 148/175 |
| 4,165,471 | 8/1979 | Ahrenkeil | 357/61 X |
| 4,179,308 | 12/1979 | Olsen et al. | 357/30 X |
| 4,188,244 | 2/1980 | Itoh et al. | 357/16 X |
| 4,213,781 | 7/1980 | Noreika et al. | 357/61 X |
| 4,225,409 | 9/1980 | Minomura | 204/192 |
| 4,257,057 | 3/1981 | Cheung et al. | 357/16 X |
| 4,288,757 | 9/1981 | Kajimura et al. | 357/16 X |
| 4,296,425 | 10/1981 | Nishizawa | 357/38 X |
| 4,400,244 | 8/1983 | Kroger et al. | 204/2.1 |
| 4,445,965 | 5/1984 | Milnes | 156/624 |
| 4,495,262 | 1/1985 | Matsuzaki et al. | 357/31 X |

FOREIGN PATENT DOCUMENTS

| | | | |
|---|---|---|---|
| 80342 | 2/1982 | European Pat. Off. | 136/258 |
| 45195 | 6/1983 | European Pat. Off. | 136/260 |
| 0092409 | 10/1983 | European Pat. Off. | 357/63 X |
| 2046090 | 3/1971 | France | |
| 2513274 | 3/1983 | France | 357/63 X |
| 48-88027 | 11/1973 | Japan | 357/30 |
| 49-73686 | 7/1974 | Japan | 357/30 |
| 2108404A | 5/1983 | United Kingdom | 357/63 X |

OTHER PUBLICATIONS

Jacob, "Growth of Dislocation-Free GaAs Crystals by Nitrogen Doping," *Journal of Crystal Growth*, 59 (1982), 669–671.

W. P. Dumke et al., "Use of Ge in Si Crystals to Improve the Yield of Integrated Circuit Chips," *IBM Tech. Discl. Bull.*, vol. 21, No. 11, Apr. 1979, pp. 4678–4679.

B. O. Kolbesen et al, "Carbon in Silcon: Properties and Impact on Devices," *Solid-State Electronics*, vol. 25, No. 8, pp. 759–775, 1982.

Seki et al, "Impurity Effect on Grown-in Dislocation Density of InP and GaAs Crystals", *J. Appl. Phys.* 49(2), Feb. 1978, pp. 822–828.

(List continued on next page.)

*Primary Examiner*—Andrew J. James
*Assistant Examiner*—William Mintel

[57] ABSTRACT

An integrated circuit bulk substrate having a zinc blende or Wurtzite crystalline structure is alloyed with a material having atoms that replace atoms of the host semiconductor. The alloyed atoms have a bond length with the nearest neighboring host atoms that is less than the bond length of the host atoms. The number of bonded alloyed atoms is small compared to the number of host atoms so as not to substantially affect electronic conduction properties of the host material, but is large enough to virtually eliminate dislocations over a large surface area and volume of the host material on which active semiconductor devices are located.

114 Claims, 2 Drawing Figures

OTHER PUBLICATIONS

Jacob et al, "Dislocation-Free GaAs and in P Crystals by Isoelectronic Doping," *Journal of Crystal Growth*, 61 (1983), pp. 417-424.

A. Sher et al., "Phenomena Influencing the Dislocation Density of Semiconductor Compounds and Alloys[a]"; Proceedings of 13th Int'l. Conference on Defects in Semiconductors, sponsored by Electronic Materials Committee of the Metallurgical Society of AIME, held at Coronado, Calif., Aug. 12-17, 1984.

Electronics, vol. 57, No. 2, Jan. 1984 (New York), "New Technique Produces GaAs Crystals with 100 Dislocations/cm$^2$", p. 67.

T. Chikamura, "Spectral Response of ZnSe-Zn$_{1-x}$Cd$_x$Te Heterojunction", *J. Appl. Phys.* 53(7), Jul. 1982, pp. 5146-5153.

S. L. Bell et al, "Growth and Characterization of Cadmium Zinc Telluride", presented at the *IRIS Detector Specialty Group Meeting*, Boulder, Colorado, Aug. 1983.

T. W. James et al., "Blocking of Threading Dislocations by Hg$_{1-x}$Cd$_x$Te Epitaxial Layers", submitted to A.P.L., Aug. 1983.

Timothy W. James et al, "The Influence of Growth Conditions on the Interfacial Dislocation Structure of LPE Hg$_{1-x}$Cd$_x$Te", presented at IRIS Detector Specialty Group Meeting, Boulder, CO (Aug. 1983).

Razykov, T. M. et al., "Photovoltaic Effect in Heterojunctions Made of Zinc and Cadmium Tellurides", *Sov. Phys. Semicond.* 17(5), May 1983, pp. 585-586.

Hendrik J. Gerritsen, "Electrochemical Deposition of Photosensitive CdTe and ZnTe on Tellurium", *Journal of the Electrochemistry Soc.*, Jan. 1984, pp. 136-140.

Fahrenbruch et al, "Recent Investigations of Metal Oxide/CdTe Heterojunction Solar Cells", 13*th IEEE Photovoltaic Conf.*, Jun. 1978, pp. 281-287.

Fahrenbruch et al, "Photovoltaic Heterojunctions for Solar Energy Conversion", 11*th IEEE Photovoltaic Conf.*, May, 1975, pp. 490-496.

Fahrenbruch et al, "II-VI Photovoltaic Heterojunctions for Solar Energy Coversion", *Appl. Physics*, vol. 25, No. 10, Nov. 1974, pp. 605-608.

Buch et al, "Photovoltaic Properties of n-CdSe/p-ZnTe Heterojunctions", *Appl. Physics Letters*, vol. 28, No. 10, May 1976, pp. 593-595.

Aranovich et al, "ZnO Films and ZnO/CdTe Heterojunctions Prepared Using Spray Pyrolysis", 14*th IEEE Photovoltaic Spec. Conf*, San Diego, California, Jun. 1980, pp. 633, 634.

Yin et al, "Photovoltaic Properties of ZnCdS/CdTe Heterojunctions Prepared by Spray Pyrolysis", *J. Appl. Phys.* 49(3), Mar. 1978, pp. 1294-1296.

Serreze et al, "Spray Pyrolysis Prepared CdTe Solar Cells", 15*th IEEE Photovoltaic Spec. Conf.*, Kissimmee, Florida, May 1981, pp. 1068-1072.

Jaeger et al, "Transition Resistances of Ohmic Contacts to p-Type CdTe and Their Time-Dependent Variation", Journ. of Electronic Materials, vol. 10, No. 3, 1981, pp. 605-618.

Bube et al, "Photovoltaic Energy Conversion with n-CdS-p-CdTe Heterojunctions and Other II-VI Junctions", IEEE Transactions on Electron Devices, vol. ED-24, No. 4, Apr. 1977, pp. 487-492.

*Chem. Abstracts*, vol. 95 (1981), Abs. 222881p; 222882q; 222883r.

*Chem. Abstracts*, vol. 92 (1980), Ab. 61712e.

Aranovich et al, "Photovoltaic Properties of ZnO/CdTe Heterojunctions Prepared by Spray Pyrolysis", J. Appl. Phys. 51(8), Aug. 1980, pp. 4260-4268.

Fahrenbruch et al, "Recent Results on II-VI Heterojunctions for Photovoltaic Solar Energy Conversion", 12th IEEE Conf., Nov. 1976, pp. 529-533.

R. Radojcic et al, *Solar Cells*, vol. 4, pp. 101-107 (1981).

Jacob, G. et al, "Disclocation-Free GaAs and InP Crystals by Isoelectronic Doping", *J. of Crystal Growth*, vol. 61 (1983), pp. 417-424.

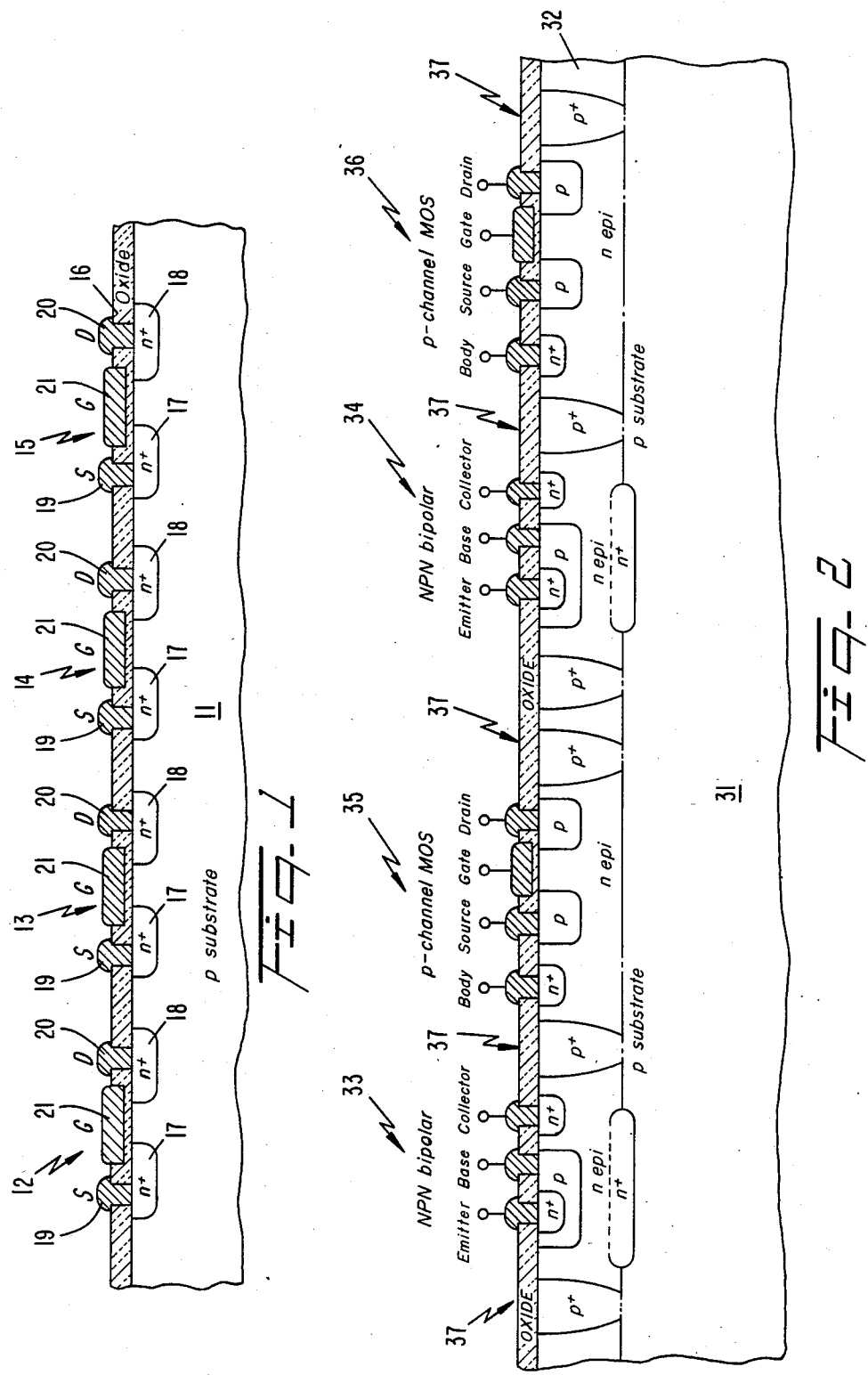

INTEGRATED CIRCUIT HAVING DISLOCATION FREE SUBSTRATE

SOURCE OF INVENTION

This work was supported by a Sub-contract under Contract Number MDA 903-83-C-0100 from the Defense Supply Service, Washington, D.C., Department of Army.

TECHNICAL FIELD

The present invention relates generally to integrated circuits and more particularly to an integrated circuit having a substrate with a tetrahedral structured crystalline host semiconductor material bonded with a material having atoms that replace some of the atoms of the host material wherein the alloyed atoms have a bond length with the nearest neighboring host atom that is less than the bond lengths of the host atoms so as to virtually eliminate dislocations over a large surface area and volume of the host material on which are located at least several active semiconductor devices.

BACKGROUND ART

Integrated circuit substrates have generally been formed of silicon because silicon can be grown virtually dislocation free. It is necessary for an integrated circuit to have a substrate that is virtually dislocation free because it is generally impossible to provide active semiconductor devices that operate correctly in a substrate volume having a dislocation. This is applicable to threading dislocations, i.e., dislocations which intersect a face of the substrate on which active semiconductor devices are located, as well as dislocations that extend parallel to the face containing active semiconductor devices. Threading dislocations have a tendency to collect active device materials deposited on the substrate face. The dislocations which extend parallel to the face have an adverse effect on diffused materials forming junctions semiconductor active devices.

While silicon is when properly grown, virtually dislocation free, and has been satisfactorily employed as a bulk substrate for integrated circuits, there are certain disadvantages associated with the use of silicon as a bulk substrate for an integrated circuit. The mobility of silicon is relatively low, thereby limiting the operating speed of devices fabricated on silicon substrates. In addition, it is desriable in certain types of devices to tailor a bulk substrate band gap which frequently can not be done with pure dislocation free silicon substrates.

Seiki et al, in an article entitled Impurity Effect On Grown-In Dislocation Density of InP and GaAs crystals, Journal of Applied Physics, Volume 49, No. 2, February, 1978, Pages 822-828 indicates that dislocation density in indium phosphide crystals is reduced by doping sulfur or tellurium into the indium phosphide polycrystalline starting materials. Seiki et al also states that dislocations in gallium arsenide can be reduced by doping suphur, tellurium, aluminum or nitrogen into gallium arsenide polycrystalline starting materials. Jacob further reports in the Journal of Crystal Growth, Volume 59, 1982, Pages 669-671, on doping gallium arsenide with nitrogen to reduce dislocation density. Jacob indicates that the technique employed by Seiki et al reduced dislocation density only in small diameter crystals and only in the central part of a boule. Seiki et al apparently originally believed that alloying zinc would replace dislocations but found experimentally that this is not useful for gallium arsenide crystals.

The number of dopant atoms added by Seiki et al to indium phosphide and gallium arsenide was a small fraction of one-percent of the number of atoms in the indium phosphide and gallium arsenide. Seiki et al indicates that the carrier concentration of the dopants added to the indium phosphide crystals was in the order of $10^{17}$–$10^{19}$ dopant carriers per cubic cm; the dopant concentrations added to the gallium arsenide crystals were between approximately $5 \times 10^{17}$–$2 \times 10^{19}$ carriers per cubic cm. The maximum molecular fractions of the alloyed dopants in these situations are $x = 0.001$ and $x = 0.002$, respectively. Jacob added gallium nitride to gallium arsenide crystals, such that the gallium nitride concentrations were $1.2 \times 10^{-4}$–$8 \times 10^{-3}$ grams per gram of gallium arsenide crystals. All of the foregoing doping effects result in molecular percentages of the dopant to the crystalline material that are a fraction of one percent.

Seiki attributed the reduced dislocations resulting from addition of dopants to the bonding strength of the dopant atoms relative to the bonding strength of the host atoms. I have found that this assumption is incorrect and accounts for the reason why Seiki et al was unable to obtain reduced dislocations by adding zinc to gallium arsenide. The bond strength between the nearest neighboring bonded atoms of a crystalline material is composed of the ionic, covalent and metallic forces which bond the atoms together. The ionic bond is not rigid but is free to turn, in contrast to the rigid covalent bond. Because the ionic bond is not rigid, it does not contribute to the shear modulus of the material which is an important factor concerning dislocation density. Thus, some crystals can have very strong ionic bonds between adjacent atoms, but have a high dislocation density because of the ability of ionic bonds to turn. To minimize dislocations, it is necessary to consider all three forces which bond adjacent atoms together, viz: the ionic bond, the covalent bond, and the metallic bond; the latter bonds are much more important than the former.

It is, accordingly, an object of the present invention to provide a new and improved semiconductor circuit structure having a substrate having virtually no dislocations over a large surface area and volume on which at least several active semiconductor devices are located.

A further object of the invention is to provide a new and improved high speed semiconductor structure.

Still another object of the invention is to provide a new and improved semiconductor structure having a virtually dislocation free, wide band gap substrate on which can be located power transistors that are likely to operate at high temperatures.

A further object of the invention is to provide a new and improved semiconductor structure having a virtually dislocation free substrate which is capable of containing very high speed electronic active elements.

DISCLOSURE OF INVENTION

In accordance with the present invention, a semiconductor circuit structure comprises a bulk substrate formed of a tetrahedral structured crystalline host semiconductor material including atoms bonded at least by covalent and metallic forces. The nearest neighboring bonded atoms of the host material have a known bond length. The host material is alloyed with atoms that replace some of the atoms of the host material so that the alloyed and host atoms are bonded at least by covalent and metallic forces. The alloyed atoms have a bond length with the nearest neighboring host atoms that is less than the known host bond length. The number of bonded alloyed atoms is small compared to the number of bonded host atoms so as not to substantially affect electronic conduction properties of the host material.

The number of bonded alloy atoms is sufficient to virtually eliminate dislocations over a large surface area and volume of the host material. At least several, i.e., more than two, active semiconductor devices are located on the large surface area and volume.

The active semiconductor devices can include junctions, such as bipolar and metal oxide semiconductor field effect transistors, or charge coupled devices. Devices having junctions and charge coupled devices are extensively employed in large scale integrated circuits. In addition, the active semiconductor devices can be plural parallel connected bipolar and metal oxide semiconductor power transistors having a relatively large area and which together are capable of dissipating hundreds of watts. The active semiconductor devices can also include high frequency oscillators of the transient type, which do not have junctions.

The bulk substrate of the present invention can also be used as a substrate on which an epitaxial layer is formed. The epitaxial layer is formed of the same host semiconductor and alloy in the same manner by the same alloyed atoms as the bulk substrate to form a region having a large surface and volume virtually free of dislocations. The epitaxial layer has a greater purity than the bulk substrate. The active semiconductor devices are located in the thus formed region of the epitaxial layer.

For high speed integrated circuit applications, the host dislocation free material can be indium phosphide, gallium arsenide or indium antimonide. The indium phosphide and gallium arsenide host materials have good high speed characteristics, while the indium antimonide has good very high speed characteristics, although they must be operated at liquid nitrogen temperatures.

The host semiconductor material can be a Group IV pseudo-elemental semiconductor, in which the alloyed atoms are a Group IV semiconductor element different from the host element. (In the present specification and claims, the term "pseudo-elemental semiconductor" is defined as a semiconductor compound consisting of two or more elements from the same column of the Periodic Table and having the same lattice structure as an elemental semiconductor from the same column.) In such a case, the host pseudo-elemental semiconductor is selected from the group consisting of silicon, germanium and tin and the alloyed atoms are selected from the group consisting of carbon and silicon to achieve the required bond length criterion. To enable the band gap of such a host Group IV pseudo-elemental semiconductor to be controlled, the host pseudo-elemental semiconductors is selected from the group consisting of $Ge_{1-x}Sn_x$ and $Si_{1-x}Ge_x$, where x is between zero and one, depending upon the desired band gap of the substrate. Such host materials are preferably alloyed with carbon to form semiconductor substrates of the form:

$Si_{1-x-y}Ge_xC_y$, $Ge_{1-x-y}Sn_xC_y$, or
$Ge_{1-x-y}Sn_xSi_y$, where $0<x<1$, $0<y 0.2$.

In accordance with a further aspect of the invention, the host semiconductor material is a pseudo-binary compound of first and second types of atoms between which subsist the host material bonds having the known bond lengths. (Types of atoms, as referred to in the present specification and claims, are atoms from the same column of the periodic chemical table). The alloy includes third atoms of the second type that replace some of the second types of atoms to form bonds with the first types of atoms having bond lengths that are less than the host bond lengths. In such a configuration the alloy can be a pseudo-binary semiconductor compound of the first type of atom and of the third atoms. The alloy has a bond length between the first types of atoms and the third atoms less than the bond lengths of the host material between the first and second types of atoms.

The host and alloyed semiconductors form a semiconductor compound of the form $M_{1-x}Q_xR$, where M and Q are selected from the semiconductors of Groups II and III, and R is selected from the semiconductors of Groups VI and V, respectively, and x is in the range between 0.01 and 0.3.

For the power transistor applications, the host semiconductor material is either aluminum phosphide (AlP) or gallium phosphide (GaP). The aluminum phosphide is alloyed with boron phosphide (BP) or aluminum nitride (AlN), which respectively form the alloys $Al_{1-x}B_xP$ and $AlP_{1-y}N_y$. For a gallium phosphide host material, gallium nitride (GaN) is alloyed to form $GaP_{1-y}N_y$; in all three of the alloys of aluminum phosphide and gallium phosphide x and y are in the range from 0.01 to 0.1. Because aluminum phosphide and gallium phosphide are used as substrates for wide band gap, high temperature power transistors, the values of x and y should not exceed 0.1 because the band gap of the host aluminum phosphide and gallium phosphide materials is increased by the addition of the boron and nitrogen atoms.

For the highest speed integrated circuit devices, the host bulk substrate material is preferably indium antimonide and the alloyed compounds to achieve the required bond length relationship are selected from the group consisting essentially of gallium antimonide (GaSb), indium phosphide (InP), indium nitride (InN) and boron antimonide (BSb), which respectively form the alloys $In_{1-x}Ga_xSb$, $InSb_{1-y}P_y$, $InSb_{1-y}N_y$ and $In_{1-x}B_xSb$, where, in each of these instances, x and y are in the range from 0.01 to 0.3. The $InSb_{1-y}N_y$ alloy has a band gap which may avoid the need for the use of cryogenic, liquid nitrogen cooling of indium antimonide substrates; however the speed of the devices formed on such substrates may be less than those formed on other InSb substrates.

Indium phosphide and gallium arsenide crystals can be alloyed with other Group III-V semiconductors to form virtually dislocation free semiconductor substrates on which are located high speed integrated circuits. The Group III-V host materials substrate indium phosphide is alloyed with gallium phosphide (GaP), aluminum phosphide (AlP), boron phosphide (BP) or indium nitride (InN) to form the alloys $In_{1-x}Ga_xP$, $In_{1-x}Al_xP$, $In_{1-x}B_xP$ and $InP_{1-y}N_y$, where x and y are both in the range from 0.01 to 0.3. Gallium arsenide can be alloyed to form a dislocation free substrate with any of the Group III-V compounds of gallium phosphide (GaP), gallium nitride (GaN) or boron arsenide (BAs), which respectively form the alloys $GaAs_{1-y}P_y$, $GaAs_{1-y}N_y$ and $Ga_{1-x}B_xAs$, where x and y are in the range from 0.01 to 0.3.

Dislocations can be virtually eliminated in bulk substrates formed of the Group II-VI compounds cadmium sulphide (CdS), cadmium telluride (CdTe) and mercury telluride (HgTe) by addition of appropirate Group II-VI compounds. In particular, zinc sulphide (ZnS) is added to a cadmium sulphide host to form $Cd_{1-x}Zn_xS$, where x is in the range between 0.01 and 0.3. Cadmium telluride is alloyed with zinc telluride (ZnTe), cadmium selenide (CdSe), cadmium sulphide (CdS) or magnesium telluride (MgTe) to respectively form the alloys $Cd_{1-x}Zn_xTe$, $CdTe_{1-y}Se_y$, $CdTe_{1-y}S_y$ and $Cd_{1-x}Mg_xTe$, where x and y are in the range from 0.01 to 0.3. The host material mercury telluride (HgTe) is alloyed with any of the compounds zinc telluride (ZnTe), mercury selenide (HgSe), mercury sulphide (HgS) or magnesium telluride (MnTe) to respectively form the alloys $Hg_{1-x}Zn_xTe$, $HgTe_{1-y}Se_y$, $HgTe_{1-y}S_y$ and $Hg_{1-x}Mg_xTe$, where x and y both are in the range from 0.01 to 0.3.

If necessary, dislocation density can be further reduced by alloying a second dislocation suppression agent to the host and the first alloyed material. In such a situation, the host semiconducting material is preferably a pseudo binary compound of first and second types of atoms between which subsists the host material bonds having the known bond lengths. The alloy includes third and fourth atoms to form further and additional bonds with one atom type of the host. The further bonds have lengths that are shorter than the known host bond lengths, while the additional bonds have lengths that are shorter than lengths of the further bonds and therefore shorter than the lengths of the host material bonds.

In one such embodiment, the third atoms replace some of the atoms of the second type to form the further bonds with the atoms of the first type, and the fourth atoms replace some of the third atoms to form the additional bonds. The host in such a situation can be considered as the semiconductor compound MA and the third and fourth atoms can be considered as the elements Q and R. The resulting formed and alloyed compound is represented by $M_{1-x}Q_xA_{1-y}R_y$, where M and A are elements in equally displaced and oppositely directed first and second columns of the periodic chart relative to the fourth column, and Q and R are respectively in at least one of said first and second columns that are oppositely directed relative to the fourth column. In one embodiment, the first and second oppositely directed columns are respectively the third and fifth columns of the periodic chart. To provide the required replacement without affecting electron conduction properties of the host, y is greater than x, x is greater than 0, and x+y is less than 0.3.

In one particular embodiment, the host is gallium arsenide and the formed and alloyed compound is $Ga_{1-x}B_xAs_{1-y}P_y$. To form $Ga_{1-x}B_xAs_{1-y}P_y$, gallium arsenide is a host material that is alloyed with GaP and BP. The phosphor in the GA replaces some of the arsenic in the GaAs host to form the further bonds with the gallium, while the boron in the BP replaces some of the gallium atoms to form the additional bonds.

In accordance with a further embodiment, the third atoms replace some of the atoms of the second type to form the further bonds with the atoms of the first type and the fourth atoms replace some of the second atoms to form the additional bonds. In such a situation, the host is considered as the pseudo binary compound MA and the third and fourth atoms are the elements Q and R. The formed and alloyed compound in such an instance is represented by $MQ_{1-y-z}A_yR_z$, where M and A are semiconductors in equally displaced oppositely directed first and second columns of the periodic chart relative to the fourth column; Q and R are in the second column. The value of y is greater than that of z, z is greater than 0 and y+z is less than 0.3. Again, the first and second displaced and oppositely directed columns relative to the fourth column are the third and fifth columns of the periodic chart in a preferred embodiment.

In one particular embodiment, the host is gallium arsenide and the formed and alloyed compound is $GaAs_{1-y-z}P_yN_z$, where y is greater than z, z is greater than 0 and y+z is less than 0.3. Such a compound is formed by alloying arsenic phosphide and arsenic nitride into gallium arsenide so that the phosphor atoms in the arsenic phosphide replace some of the arsenic atoms in the host to form the further bonds with the gallium atoms. The nitrogen atoms in the arsenic nitride replace some of the arsenic atoms in the host to form the additional bonds.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWINGS

FIG. 1 is a schematic diagram of an integrated circuit in accordance with a first embodiment of the invention, wherein several active semiconductor devices are located in a host semiconductor material; and FIG. 2 is a schematic diagram of a second embodiment of an integrated circuit formed in accordance with the invention, wherein several active semiconductor devices are located on an epitaxial layer formed on a host semiconductor.

BEST MODE FOR CARRYING OUT THE INVENTION

Reference is now made to FIG. 1 of the drawing wherein there is illustrated a dislocation free p doped substrate 11 on which are located four metal oxide field effect transistors 12, 13, 14 and 15 which are part of an integrated circuit structure that includes at least several active semiconductor devices. Each of metal oxide semiconductor field effect transistors is formed in substrate 11 and thin film oxide layer 16 on the substrate. Each of metal oxide semiconductor field effect transistors 12-15 includes n+ doped regions 17 and 18 that are formed by diffusion into substrate 11. Regions 17 and 18 are respectively connected to source and drain electrodes 19 and 20 which are formed on the top face of oxide layer 16 and which penetrate the oxide layer so that the electrodes contact the n+ type regions. Deposited between electrodes 19 and 20 on oxide region 16 is gate electrode 21 which does not penetrate oxide layer 16.

The foregoing structure is conventional, except that p substrate 11 need not be silicon, as is the case with prior art integrated circuit substrates. Instead, substrate 11 is a bulk substrate that is not silicon and is formed of a tetrahedral structured crystalline host semiconductor material that is appropriately p doped. Atoms in substrate 11 are bonded at least by covalent and metallic forces, and in many instances by ionic forces. The neighboring bonded atoms of the host material of substrate 11 have a known bond length. The host material of substrate 11 is alloyed with atoms that replace some of the atoms of the host material so that the alloyed and some of the host atoms are bonded at least by covalent and metallic forces, and frequently by ionic forces. Electrons in the sp$^3$ energy levels of neighboring atoms of p substrate 11 are bound together.

Because of the tetrahedral structure of the crystal in substrate 11, the crystals have either a Wurtzite or zinc blende configuration. In the zinc blende configuration, the nearest neighboring atoms lie along a diagonal of a cube, with the atomic spacing being equal to one-quarter of the diagonal.

Dislocations in substrate 11 are detrimental to the functioning of metal oxide semiconductor field effect transistors 12-15 because the dislocations serve as channels for impurity migration during the formation of substrate 11. The dislocations trap the impurities, to cause non-uniform doping and degradation of pn junctions between p substrate 11 and n+ regions 17 and 18. Any dislocations which are in substrate 11 decrease the resistance of substrate 11 to plastic deformation.

Adjacent atoms in p substrate 11 are bonded together by three bonding forces. The most important bonding force is covalent energy that results from interactions between the sp$^3$ electrons of adjacent atoms. The strength of the covalent energy interaction is dependent on the angle between the adjacent atoms; bond angle distortions require energy. The ionic bonding energy between adjacent atoms is relatively isotrophic and adds little to the shear coefficients that bond the adjacent atoms together. The energy to form a dislocation is dominated by shear strain energy that arises from bond angle distortions extending over many bonds around the dislocation. Thereby, the ionic contribution is not an important factor in establishing the dislocations. In fact, a tetrahedral structured crystalline semiconductor material can have an appreciable ionic bonding energy between adjacent atoms and still have a relatively high dislocation density. The metallic contribution to the bonding energy is bond angle dependent.

The net result of the covalent, ionic and metal bonds between adjacent atoms in semiconductors is to yield shear coefficients proportional to between $d^{-5}$ and $d^{-11}$, where d is the bonding distance between adjacent atoms. The shear coefficient varies as a function of d, depending on the relative magnitude of the covalent and ionic energies between the adjacent atoms. It can be shown that the shear coefficient depends on crystal orientation and is proportional to $$\frac{V_2^3}{d^5(V_2^2 + V_3^2)^{\frac{3}{2}}}$$

where $V_2$ is the covalent energy between adjacent atoms, and
$V_3$ is the ionic energy between adjacent atoms.

It can also be shown that $V_2$ is directly proportional to $d^{-2}$. From the foregoing, in a case where the covalent energy dominants over the ionic energy, i.e., $V_2$ is much greater than $V_3$, the shear coefficient is proportional to $d^5$; if the ionic energy dominants over the covalent energy, i.e., $V_3$ is much greater than $V_2$, the shear coefficient is proportional to $d^{-11}$.

From the foregoing, the dislocation density is a function of the distance between adjacent atoms in tetrahedral structured crystalline semiconductor substrate 11. In accordance with the invention, the number of dislocations in p substrate 11 is substantially reduced by adding atoms to the substrate which have a bond length that is less than the atoms which are in the host substrate. The added or alloyed atoms replace atoms that are originally in the host semiconductor substrate.

The p substrate 11 can initially be a Group IV pseudo elemental semiconductor, in which case the alloyed atoms are a Group IV semiconductor element different from the host element. In such an instance, the host pseudo elemental semiconductor of substrate 11 is selected from the group consisting of silicon, germanium and tin. Such a host pseudo elemental semiconductor would not include elemental silicon by itself because elemental silicon has virtually no dislocations, if properly formed. However, if it is desired to tailor the band gap of a silicon substrate, the pseudo elemental Group IV semiconductor would include compounds of silicon and germanium or silicon and tin. The Group IV atoms alloyed to such compounds are selected from the group consisting of carbon and silicon, to comply with the requirement that the alloyed atoms have a bond length with the nearest neighboring host atoms that is less than the known host bond length. Such a host p type substrate 11 would thus be selected from the group consisting of $Ge_{1-x}Sn_x$ or $Si_{1-x}Ge_x$, where x is between 0 and 1, depending upon the desired band gap of the substrate. To reduce the dislocation density of $Ge_{1-x}Sn_x$ and $Si_{1-x}Ge_x$ and still retain the electron conduction properties of the host $Ge_{1-x}Sn_x$ or $Si_{1-x}Ge_x$ material of substrate 11, the maximum concentration of the added carbon or silicon is 0.2 of the host $Ge_{1-x}Sn_x$ or $Si_{1-x}Ge_x$.

From the data in Table I, the carbon and silicon alloyed atoms have a bond length that is less than the bond length of the germanium and tin atoms in both the zinc blende and Wurtzite crystalline structures, where applicable.

TABLE I

| compound | Zinc blende d[Å] | Wurtzite d[Å] |
|---|---|---|
| C | 1.545 | 1.545 |
| Si | 2.352 | 2.356 |
| Ge | 2.450 | |
| Sn | 2.810 | |
| SiC | 1.888 | 1.895 |

It is also possible to alloy silicon carbide into $Ge_{1-x}Sn_x$ host pseudo elemental semiconductors which form substrate 11 since each of silicon and carbon has a bond length less than either germanium or tin.

The dislocation density of substrate 11 is sufficiently low in accordance with the present invention so it is possible to employ Group III-V pseudo binary compounds as the substrate on which integrated circuits are located. The criteria for selecting Group III-V alloys to be added to Group III-V host semiconductor substrates are indicated in Table II, bearing in mind that the alloyed compound must have a bond length less than that of the host compound.

TABLE II

| compound | Zinc blende d[Å] | Wurtzite d[Å] |
| --- | --- | --- |
| BN | 1.565 | 1.575 |
| AlN |  | 1.867 |
| GaN |  | 1.946 |
| InN |  | 2.134 |
| BP | 1.965 | 2.212 |
| AlP | 2.367 |  |
| GaP | 2.359 |  |
| InP | 2.541 |  |
| BAs | 2.069 |  |
| AlAs | 2.442 |  |
| GaAs | 2.448 |  |
| InAs | 2.823 | 2.625 |
| AlSb | 2.657 |  |
| GaSb | 2.639 |  |
| InSb | 2.805 |  |

Representative combinations of host materials in the III-V Groups and dislocation suppression agents, as well as the resulting alloys are indicated in Table III.

TABLE III

| Host Material | Possible Dislocation Suppresion Agent | Alloy |
| --- | --- | --- |
| 1) AlP | BP | $Al_{1-x}B_xP$ |
|  | AlN | $AlP_{1-y}N_y$ |
| 2) GaP | GaN | $GaP_{1-y}N_y$ |
| 3) InP | GaP | $In_{1-x}Ga_xP$ |
|  | AlP | $In_{1-x}Al_xP$ |
|  | BP | $In_{1-x}B_xP$ |
|  | InN | $InP_{1-y}N_y$ |
| 4) GaAs | GaP | $GaAs_{1-y}P_y$ |
|  | GaN | $GaAs_{1-y}N_y$ |
|  | BAs | $Ga_{1-x}B_xAs$ |
| 5) InSb | GaSb | $In_{1-x}Ga_xSb$ |
|  | InP | $InSb_{1-y}P_y$ |
|  | InN | $InSb_{1-y}N_y$ |
|  | BSb | $In_{1-x}B_xSb$ |

In Table III and the following tables cations and anions are respectively represented by the subscripts x and y. The values of x and y are between 0.01 and 0.3 to achieve the desired low dislocation density, while not affecting the desired electron conduction properties of the host.

If the host of substrate 11 is aluminum phosphide or gallium phosphide, the values of x and y are between 0.01 and 0.1 to enable the substrate to have a wide band gap and to operate adequately at high temperature. Such substrates are useful for power transistor applications. If, however, indium phosphide or gallium arsenide is the host material of substrate 11, the values of x and y are between 0.01 and 0.3 to enable the integrated circuit to be used for high speed room temperature applications, such as computers and computer components. If indium antimonide is the host material for substrate 11, the values of x and y are between 0.01 and 0.3 to enable the resulting integrated circuit to have very high speed and be used for microwave applications. However, most integrated circuits formed on indium antimonide substrates must be operated at cryogenic temperatures, such as the temperature of liquid nitrogen. Substrates formed of indium antimonide can also be used for infrared detection purposes.

It is to be understood that substrate 11 can be appropriately doped to achieve the desired conductivity type. Doping implies values of x and y which are considerably lower than the values of x and y between 0.1 and 0.3; a typical doping concentration has a maximum value of x=0.002.

If necessary, the dislocation density can be reduced further in host Group III-V semiconductors by adding two suppression agents, providing that both suppression agents have bond lengths less than the bond length of the host material and the second suppression agent has a bond length less than the first suppression agent. For example, the host material p substrate 11 can be gallium arsenide which is alloyed with first and second dislocation suppression agents arsenic phosphide and boron phosphide to form the alloyed compounds $Ga_{1-x}B_x As_{1-y}P_y$, where y is greater than x, x+y is less than 0.3 and x is greater than 0. From Table II, the bond length criteria are satisfied in such an instance because the bond length of gallium arsenide is 2.448 Angstroms, while the bond length of gallium phosphide and boron phosphide are respectively 2.359 and 1.965 Angstroms for the zinc blende crystalline structure.

A gallium arsenide host for substrate 11 can also be alloyed with gallium phosphide and gallium nitride even though gallium nitride has a Wurtzite crystalline structure, in contrast to the zinc blende crystalline structure of gallium arsenide and gallium phosphide. Both gallium phosphide and gallium nitride have bond lengths that are considerably less than that of gallium arsenide. The resulting compound formed by alloying gallium phosphide and gallium nitride into gallium arsenide is $GaAs_{1-y-z}P_yN_z$, where y is greater than x, which is in turn greater than z, and z is greater than 0, and the combined values of y and z is less than 0.3. The value of z is sufficiently great to provide the required additional dislocation density suppression.

Dislocation density can also be reduced in Group III-V pseudo binary host crystals having three elements. For example BSb, GaN or GaP can be alloyed with $Ga_{1-x}In_xSb$ to form $Ga_{1-x-y}In_xB_ySb$, $Ga_{1-x}In_xSb_{1-y}N_y$ and $Ga_{1-x}In_xSb_{1-y}P_y$, where $y>0$, $x>y$ and $x+y<0.3$.

Substrate 11 can also be a Group II-VI compound that is alloyed with dislocation suppression agents having bonding lengths less than those of the host material, in accordance with Table IV.

TABLE IV

| compound | Zinc blende d[Å] | Wurtzite d[Å] |
| --- | --- | --- |
| ZnO |  | 1.955 |
| ZnS | 2.341 | 2.338 |
| CdS | 2.527 | 2.518 |
| HgS | 2.543 |  |
| ZnSe | 2.455 | 2.453 |
| CdSe | 2.62 | 2.63 |
| HgSe | 2.635 |  |
| ZnTe | 2.643 | 2.659 |
| CdTe | 2.805 | 2.807 |
| HgTe | 2.797 |  |

Typical host materials selected from the semiconductors of Group II-VI are listed in Table V as cadmium sulphide, cadmium telluride and mercury telluride. Group II-VI dislocation suppression agents are listed in Table V for these three host semiconductors to form the alloys listed in the Table.

TABLE V

| Host Material | Possible Dislocation Suppression Agent | Alloy |
| --- | --- | --- |
| 6) CdS | ZnS | $Cd_{1-x}Zn_xS$ |
| 7) CdTe | ZnTe | $Cd_{1-x}Zn_xTe$ |
|  | CdSe | $CdTe_{1-y}Se_y$ |
|  | CdS | $CdTe_{1-y}S_y$ |
|  | MgTe | $Cd_{1-x}Mg_xTe$ |
| 8) HgTe | ZnTe | $Hg_{1-x}Zn_xTe$ |
|  | HgSe | $HgTe_{1-y}Se_y$ |
|  | HgS | $HgTe_{1-y}S_y$ |
|  | MgTe | $Hg_{1-x}Mg_xTe$ |

Again, the values of x and y in Table VI are sufficiently great to provide substantial elimination of dislocations, while not affecting the electron conduction properties of the host. To these ends, the values of x and y are in the range of 0.01 to 0.3. Substrates formed of Group II-VI host material compound are particularly adapted for photovoltaic solar cell applications.

Dislocation density can also be reduced in Group II-VI pseudo binary host crystals having three compounds. For example, ZnTe, CdS or CdSe can be alloyed with $Hg_{1-x}Cd_xTe$ to form $Hg_{1-x-y}Cd_xZn_yTe$, $Hg_{1-x}Cd_xTe_{1-y}S_y$ and $Hg_{1-x}Cd_xTe_{1-y}Se_y$, where $y>0$, $x>y$ and $x+y>0.3$.

The present invention is also applicable to dislocation free substrates on which are formed thin epitaxial films, as illustrated in FIG. 2. In FIG. 2 is illustrated an epitaxial device including p doped substrate 31 on which is deposited thin film epitaxial layer 32. The surface area of substrate 31 on which layer 32 is deposited is substantially free of dislocations, a result achieved by alloying a host with a suppression agent, as discussed supra in connection with substrate 11. Epitaxial layer 32 is the same compound as layer 31, and thus can be considered as having the same host semiconductor as substrate 31 and the same dislocation suppression agents as substrate 31. Epitaxial layer 32 is n doped, in contrast to the p doping of substrate 31.

Formed on substrate 31 and in epitaxial layer 32 are npn bipolar transistors 33 and 34, as well as p channel metal oxide semiconductor field effect transistors 35 and 36. The integrated circuit includes diodes 37 between the bipolar and p channel MOS active devices.

Standard crystal growing structures and techniques are employed to form substrates 11 and 31, in combination with epitaxial layer 32. For example, substrates 11 and 31 can be grown by the well known vertical modified-Bridgman technique in an appropriate furnace. Epitaxial layer 32, typically having a thickness of 20 to 200 Angstroms, can be grown on bulk crystal substrate 31 by vertical infinite-melt liquid-phase epitaxial deposition procedures.

While there have been described and illustrated several specific embodiments of the invention, it will be clear that variations in the details of the embodiments specifically illustrated and described may be made without departing from the true spirit and scope of the invention as defined in the appended claims.

I claim:

1. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material so that there is at least one atomic percent of the bonded alloy atoms in the bulk substrate, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

2. The circuit structure of claim 1 wherein the host semiconductor material is a Group IV pseudo elemental semiconductor and the alloyed atoms are a Group IV semiconductor element different from the host element.

3. The circuit structure of claim 2 wherein the pseudo elemental semiconductor selected from the group consisting of Si, Ge and Sn and the alloyed atoms are selected from the group consisting of C and Si.

4. The circuit structure of claim 3 wherein the host pseudo elemental semiconductor is selected from the group consisting of $Ge_{1-x}Sn_x$ and $Si_{1-x}Ge_x$, where $0<x<1$.

5. The circuit structure of claim 1 wherein the host semiconductor material is a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material.

6. The circuit structure of claim 5 wherein the alloy is a pseudo binary semiconductor compound of the first type of atom and of the third atoms, the alloy having a bond length between the first type of atoms and the third atoms less than the bond lengths of the host material between the first and second types of atoms.

7. The circuit structure of claim 6 wherein the host semiconductor material and the alloy semiconductor compound are different III-V compounds, the bond length of the alloyed compound being less than the bond length of the host compound.

8. The circuit structure of claim 5 wherein the host and alloyed semiconductors form a semiconductor compound of the form $MQ_{1-y}R_y$, where M is selected from the semiconductors of Groups II and III and Q and R are selected from the semiconductors of Groups VI and V, respectively, R is an element having a cation, and $0.01<y<0.3$.

9. The circuit structure of claim 8 wherein the host semiconductor consists essentially of GaAs and the formed host and alloyed semiconductor is selected from the group consisting essentially of $GaAs_{1-y}P_y$ and $GaAs_{1-y}N_y$.

10. The circuit structure of claim 5 wherein the host and alloyed semiconductors form a semiconductor compound of the form $M_{1-x}Q_xR$, where M and Q are cations selected from the semiconductors of Groups II and III and R is selected from the semiconductors of Groups VI and V, respectively, and $0.01 < x < 0.3$.

11. A semiconductor circuit structure comprising a bulk substrate formed of a tetrahedral structured crystalline host semiconductor material essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor consisting essentially of InP and the semiconductor formed by the host and alloyed semiconductors being formed of the group consisting essentially of $In_{1-x}Ga_xP$, $In_{1-x}Al_xP$ and $In_{1-x}B_xP$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

12. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom types that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor consisting essentially of InP and the semiconductor formed by the host and alloyed semiconductors being formed from the group consisting essentially of $In_{1-x}B_xP$, $In_{1-x}Al_xP$ and $In_{1-x}Ga_xP$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

13. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor consisting essentially of AlP and the semiconductor formed by the host and alloyed semiconductors being $Al_{1-x}B_xP$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming conjunctions with the host material and an electrically responsive control electrode for controlling electric conduction between an adjacent pair of said spaced regions.

14. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor being GaAs and the semiconductor formed by the host and alloyed semiconductors being $Ga_{1-x}B_xAs$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

15. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of HgTe and the semiconductor formed by the host and alloyed semiconductors being formed of the group consisting essentially of $Hg_{1-x}Zn_xTe$ and $Hg_{1-x}Mg_xTe$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

16. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms, bonds between the first and second types of atoms having the known bond length, the alloyed atoms including third and fourth atoms to form further and additional bonds with the one atom type of the host, the further bonds having lengths that are shorter than the known host bond lengths, the additional bonds having lengths that are shorter than lengths of the further bonds, the large surface and volume of the host semiconductor material being sufficient to accommodate at least several active semiconductor devices, and at least several active semiconductor devices located on said large surface area and volume of the host semiconductor material, each of said devices having:

spaced semiconductor regions forming junctions with the host material and an electrically responsive control electrode for controlling electric conduction between an adjacent pair of said spaced regions.

17. The circuit structure of claim 16 wherein the third atoms replace some of the atoms of the second type to form the further bonds with the atoms of the first type and the fourth atoms replace some of the third atoms to form the additional bonds.

18. The circuit structure of claim 17 wherein the host is MA and the third and fourth atoms are Q and R, and the formed and alloyed compound is $M_{1-x}Q_xA_{1-y}R_y$, where M and A are elements in equally displaced and oppositely directed first and second columns of the periodic chart relative to the fourth column, Q and R are respectively in at least one of said first and second columns, $y>x$, $x>0$, and $x+y<0.3$.

19. The circuit structure of claim 18 wherein the first and second columns are respectively the third and fifth columns of the periodic chart.

20. The circuit structure of claim 17 wherein the host is GaAs and the formed and alloyed compound is $Ga_{1-x}B_xAs_{1-y}P_y$, where $Y>x$, $x+y<0.3$ and $x>0$.

21. The circuit structure of claim 16 wherein the third atoms replace some of the atoms of the second type to form the further bonds with the atoms of the first type and the fourth atoms replace some of the second atoms to form the additional bonds.

22. The circuit structure of claim 21 wherein the host is MA and the third and fourth atoms are Q and R, and the formed and alloyed compound is $MQ_{1-y-z}A_yR_z$, where M and A are elements in equally displaced and oppositely directed first and second columns of the periodic chart relative to the fourth column, Q and R are in the second column, $y>z$, $z>0$, and $z+y<0.3$.

23. The circuit structure of claim 22 wherein the first and second columns are respectively the third and fifth columns of the periodic chart.

24. The circuit structure of claim 21 wherein the host is GaAs and the formed and alloyed compound is $GaAs_{1-y-z}P_yN_z$, where $y>z$, $z>0$, $y+z<0.3$.

25. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host being a pseudo binary crystal consisting of three compounds of the form $M_{1-x}A_xQ$ that is alloyed with R to form the alloyed compound $M_{1-x}A_xQ_{1-y}R_y$, where M and Q are elements in equally displaced and oppositely directed first and second columns of the periodic chart relative to the fourth column, A is in said first column and R is in said second column, $y>x$, $x>0$, and $x+y<0.3$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

26. The circuit structure of claim 25 wherein said first and second columns are respectively the third and fifth columns of the periodic chart.

27. The circuit structure of claim 25 wherein the host is $Ga_{1-x}In_xSb$ and the formed and alloyed compound is selected from the group comprising $Ga_{1-x}In_xSb_{1-y}N_y$ and $Ga_{1-x}In_xSb_{1-y}P_y$, where $y>x$, $x+y<0.3$ and $x>0$.

28. The circuit structure of claim 25 wherein said first and second columns are respectively the second and sixth columns of the periodic chart.

29. The circuit structure of claim 28 wherein the host is $Hg_{1-x}Cd_xTe$ and the formed and alloyed compound is selected from the group comprising $Hg_{1-x}Cd_xTe_{1-y}S_y$ and $Hg_{1-x}Cd_xTe_{1-y}Se_y$.

30. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host being a pseudo binary crystal consisting of three compounds of the form $M_{1-x}A_xQ$, the pseudo binary crystal being alloyed with R to form the alloyed compound $M_{1-x-y}A_xR_yQ$, where M and Q are semiconductors in equally displaced and oppositely directed first and second columns of the periodic chart relative to the fourth column, A and R are in the first column, $y>x$, $x>0$, and $x+y<0.3$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

31. The circuit structure of claim 30 wherein said first and second columns are respectively the third and fifth columns of the periodic chart.

32. The circuit structure of claim 30 wherein the host is $Ga_{1-x}In_xSb$ and the formed and alloyed compound comprises $Ga_{1-x-y}In_xB_ySb$, where $y>x$, $x+y<0.3$ and $x>0$.

33. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area of the host material so that there is at least one atomic percent of the bonded alloy atoms in the bulk substrate, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices and at least several active semiconductor devices located on said epitaxial layer, each of said devices having spaced semiconductor regions forming junctions with the epitaxial layer and an electrically responsive control electrode for controlling electric conduction between an adjacent pair of said spaced regions.

34. A power transistor structure comprising a bulk substrate formed of a tetrahedral structured crystalline host semiconductor material consisting essentially of bonded host atoms bonded at least by covalent and metallic forces, the host semiconductor being GaP having a first predetermined conductivity type, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host material being sufficient to accommodate at least several active semiconductor devices, the alloy atoms for the host semiconductor being nitrogen to form the substrate as the alloy consisting of $GaP_{1-y}N_y$, where $0.01 < y < 0.1$, said large surface area and volume of the host material including a plurality of spaced doped regions in the substrate to form plural junctions between the regions and the substrate, a control electrode positioned relative to the substrate and the spaced regions for controlling the conductivity between adjacent pairs of said spaced regions, and an electrode connected to each of said spaced regions.

35. A power transistor structure comprising a bulk substrate formed of a tetrahedral structured crystalline host semiconductor material consisting essentially of bonded host atoms bonded at least by covalent and metallic forces, the host semiconductor being AlP having a first predetermined conductivity type, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host material being sufficient to accommodate at least several active semiconductor devices, the alloy atoms for the host semiconductor being selected from the group consisting of B and Al to form the substrate as the alloy respectively consisting of $Al_{1-x}B_xP$, or $AlP_{1-y}N_y$, where $0.01 < x < 0.1$, and $0.01 < y < 0.1$, said large surface area of the host material including a plurality of doped spaced regions in the substrate to form plural junctions between the regions and the substrate, a control electrode positioned relative to the substrate and the spaced regions for controlling the conductivity between adjacent pairs of said spaced regions, and an electrode connected to each of said spaced regions.

36. A high speed room temperature integrated circuit comprising a bulk substrate formed of a tetrahedral structured crystalline host semiconductor material consisting essentially of bonded host atoms bonded at least by covalent and metallic forces, the host semiconductor being InP having a first predetermined conductivity type, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host material being sufficient to accommodate at least several active semiconductor devices, the alloy atoms for the host semiconductor being selected from the group consisting of Ga, Al, B and In to form the substrate as the alloy respectively consisting of $In_{1-x}Ga_xP$, or $IN_{1-x}Al_xP$, or $In_{1-x}B_xP$, or $InP_{1-y}N_y$, where $0.01 \leq x \leq 0.3$, $0.01 \leq y \leq 0.3$, said large surface area of the host material including several transistors, each having spaced doped regions in the substrate and a control electrode between pairs of said spaced regions.

37. A high speed room temperature integrated circuit comprising a bulk substrate formed of a tetrahedral structured crystalline host semiconductor mateiral consisting essentially of bonded host atoms bonded at least by covalent and metallic forces, the host semiconductor being GaAs having a first predetermined conductivity type, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host material being sufficient to accommodate at least several active semiconductor devices, the alloy atoms for the host semiconductor being selected from the group consisting of P, N, B to form the substrate as the alloy respectively consisting of $GaAs_{1-y}P_y$, or $GaAs_{1-y}N_y$, or $Ga_{1-x}B_xAs$, where $0.01 \leq x < 0.3$, $0.01 < y < 0.3$, said large surface area of the host material including several transistors, each having spaced doped regions in the substrate and a control electrode.

38. A microwave integrated circuit comprising a bulk substrate formed of a tetrahedral structured crystalline host semiconductor material consisting essentially of bonded host atoms bonded at least by covalent and metallic forces, the host semiconductor being InSb having a first predetermined conductivity type, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the post material, the number of bonded alloy atoms being sufficient to virtually eliminate dislocations over a large surface area and volume of the host material, the large surface and volume of the host material being sufficient to accommodate at least several active semiconductor devices, the alloy atoms for the host semiconductor being selected from the group consisting of Ga, P, N and B to form the substrate as the alloy respectively consisting of $In_{1-x}Ga_xSb$, or $InSb_{1-y}P_y$, or $InSb_{1-y}N_y$, or $In_{1-x}B_xSb$, where $0.01 \leq x \leq 0.3$, $0.01 \leq y \leq 0.3$, said large surface area of the host material including several transistors, each having spaced doped regions in the substrate and a control electrode between pairs of said spaced regions.

39. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area of the host material, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the host semiconductor consisting essentially of HgTe and the alloy semiconductor is Zn and the substrate and epitaxial layer formed by the host and alloy each consists essentially of $Hg_{1-x}Zn_xTe$, where $0.01 \leq x < 0.3$, the large surface and volume of the epitaxial layer being sufficient to accommodate at least several active semiconductor devices and at least several active semiconductor devices located on said epitaxial layer, each of said devices having spaced semiconductor regions forming junctions with the epitaxial layer and an electrically responsive control electrode for controlling electric conduction between an adjacent pair of said spaced regions.

40. A semiconductor circuit structure comprising a bulk substrate formed of a tetrahedral structured crystalline Group IV pseudo elemental host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the alloyed semiconductor atoms being selected from the group consisting essentially of Si and C, the formed bulk and alloyed semiconductors being selected from the group consisting essentially of $Si_{1-x-y}Ge_xC_y$, $Ge_{1-x-y}Sn_xC_y$, and $Ge_{1-x-y}Sn_xSi_y$, where $0 < x < 1$, $0 < y < 0.2$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

41. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being InSb and the alloyed compound being selected from the group consisting essentially of GaSb, InP, InN and BSb, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

42. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being a pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being AlP and the alloyed compound being selected from the group consisting essentially of BP and AlN, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

43. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InSb and the formed host and alloyed semiconductor being selected from the group consisting essentially of $InSb_{1-y}P_y$ and of $InSb_{1-y}N_y$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

44. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InP and the semiconductor formed by the host and alloyed semiconductor being $InP_{1-y}N_y$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the most material and an electrically responsive control electrode for controlling electric conduction between an adjacent pair of said spaced regions.

45. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups IV and V, respectively, R is an element having a cation, and $0.01 < y < 0.3$, the host semiconductor consisting essentially of AlP and the formed host and alloyed semiconductor being $AlP_{1-y}N_y$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

46. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of GaP and the formed host and alloyed semiconductor being $GaP_{1-y}N_y$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

47. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of HgTe and the formed host and alloyed semiconductor being selected from the group consisting essentially of $HgTe_{1-y}Se_y$ and $HgTe_{1-y}S_y$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

48. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor consisting essentially of HgTe and the alloy semiconductor is Zn and the substrate formed by the host and alloy consisting essentially of $Hg_{1-x}Zn_xTe$, where $0.01 \leq x < 0.3$, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

49. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the host being $Hg_{1-x}Cd_xTe$ and the formed and alloyed compound being $Hg_{1-x-y}Cd_xZn_yTe$, where $y > x$, $x > 0$, and $x + y < 0.3$, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host semiconductor material being sufficient to accommodate at least several active semiconductor devices, and at least several active semiconductor devices located on said large surface area and volume of the host semiconductor material, each of said devices having: spaced semiconductor regions forming junctions with the host material and an electrically responsive control electrode for controlling electric conduction between an adjacent pair of said spaced regions.

50. A semiconductor circuit structure comprising a bulk substrate formed of a tetrahedral structured crystalline Group IV pseudo elemental host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the alloyed semiconductor atoms being selected from the group consisting essentially of Si and C, the formed bulk and alloyed semiconductors being selected from the group consisting essentially of $Si_{1-x-y}Ge_xC_y$, $Ge_{1-x-y}Sn_xC_y$, and $Ge_{1-x-y}Sn_xSi_y$, where $0 < x < 1$, $0 < y < 0.2$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

51. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being a pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being InSb and the alloyed compound being selected from the group consisting essentially of GaSb, InP, InN and BSb, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

52. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being a pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being AlP and the alloyed compound being selected from the group comsisting essentially of BP and AlN, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

53. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InSb and the formed host and alloyed semiconductor being selected from the group consisting essentially of $InSb_{1-y}P_y$ and of $InSb_{1-y}N_y$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

54. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InP and the semiconductor formed by the host and alloyed semiconductor being $InP_{1-y}N_y$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

55. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of AlP and the formed host and alloyed semiconductor being $AlP_{1-y}N_y$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

56. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of GaP and the formed host and alloyed semiconductor being $GaP_{1-y}N_y$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

57. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01<y<0.3$, the host semiconductor consisting essentially of HgTe and the formed host and alloyed semiconductor being selected from the group consisting essentially of $HgTe_{1-y}Se_y$ and $HgTe_{1-y}S_y$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

58. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of InP and the semiconductor formed by the host and alloyed semiconductors being formed of the group consisting essentially of $In_{1-x}Ga_xP$, $In_{1-x}Al_xP$ and $In_{1-x}B_xP$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

59. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of InP and the semiconductor formed by the host and alloyed semiconductors being formed from the group consisting essentially of $In_{1-x}B_xP$, $In_{1-x}Al_xP$ and $In_{1-x}Ga_xP$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

60. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor consisting essentially of AlP and the semiconductor formed by the host and alloyed semiconductors being $Al_{1-x}B_xP$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

61. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor being GaAs and the semiconductor formed by the host and alloyed semiconductors being $Ga_{1-x}B_xAs$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

62. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01 < x < 0.3$, the host semiconductor consisting essentially of HgTe and the semiconductor formed by the host and alloyed semiconductors being formed of the group consisting essentially of $Hg_{1-x}Zn_xTe$ and $Hg_{1-x}Mg_xTe$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

63. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms, bonds between the first and second types of atoms having the known bond length, the alloyed atoms including third and fourth atoms to form further and additional bonds with the one atom type of the host, the further bonds having lengths that are shorter than the known host bond lengths, the additional bonds having lengths that are shorter than lengths of the further bonds, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

64. The circuit structure of claim 63 wherein the host is $Ga_{1-x}In_xSb$ and the formed and alloyed compound is selected from the group comprising $Ga_{1-x}In_xSb_{1-y}N_y$ and $Ga_{1-x}In_xSb_{1-y}P_y$, where $y>x$, $x+y<0.3$ and $x>0$.

65. The circuit structure of claim 63 wherein the host is $Hg_{1-x}Cd_xTe$ and the formed and alloyed compound is selected from the group comprising $Hg_{1-x}Cd_xTe_{1-y}S_y$ and $Hg_{1-x}Cd_xTe_{1-y}Se_y$.

66. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor consisting essentially of HgTe and the alloy semiconductor is Zn and the substrate formed by the host and alloy consisting essentially of $Hg_{1-x}Zn_xTe$, where $0.01 \leq x < 0.3$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

67. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host being a pseudo binary crystal consisting of three elements of the form $M_{1-x}A_xQ$ that is alloyed with R to form the alloyed compound $M_{1-x}A_xQ_{1-y}R_y$, where M and Q are elements in equally displaced and oppositely directed first and second columns of the periodic chart relative to the fourth column, A is in said first column and R is in said second column, $y>x$, $x>0$, and $x+y<0.3$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

68. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material the host being a pseudo binary crystal consisting of three elements of the form $M_{1-x}A_xQ$, the pseudo binary crystal being alloyed with R to form the alloyed compound $M_{1-x-y}A_xR_yQ$, where M and Q are semiconductors in equally displaced and oppositely directed first and second columns of the periodic chart relative to the fourth column, A and R are in the first column, $y>x$, $x>0$, and $x+y<0.3$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

69. The circuit structure of claim 68 wherein the host is $Ga_{1-x}In_xSb$ and the formed and alloyed compound comprises $Ga_{1-x-y}In_xB_ySb$, where $y>x$, $x+y<0.3$ and $x>0$.

70. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor consisting essentially of HgTe and the alloy semiconductor is Zn and the substrate formed by the host and alloy consisting essentially of $Hg_{1-x}Zn_xTe$, where $0.01 \leq x < 0.3$, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

71. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the host being $Hg_{1-x}Cd_xTe$ and the formed and alloyed compound being $Hg_{1-x-y}Cd_xZn_yTe$, where $y>x$, $x>0$, and $x+y<0.3$, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the large surface and volume of the host semiconductor material being sufficient to accommodate at least several semiconductor devices, and at least several semiconductor devices located on said large surface area and volume of the host semiconductor material, each of said devices having semiconductor regions forming junctions with the host material.

72. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the host being $Hg_{1-x}Cd_xTe$ and the formed and alloyed compound being $Hg_{1-x-y}Cd_xZn_yTe$, where $y>x$, $x>0$, and $x+y<0.3$, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

73. A semiconductor circuit structure comprising a bulk substrate formed of a tetrahedral structured crystalline Group IV pseudo elemental host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the alloyed semiconductor atoms being selected from the group consisting essentially of Si and C, the formed bulk and alloyed semiconductors being selected from the group consisting essentially of $Si_{1-x-y}Ge_xC_y$, $Ge_{1-x-y}Sn_xC_y$, and $Ge_{1-x-y}Sn_xSi_y$, where $0<x<1$, $0<y<0.2$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices having semiconductor regions forming junctions with the epitaxial layer.

74. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being a pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being InSb and the alloyed compound being selected from the group consisting essentially of GaSb, InP, InN and BSb, and epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

75. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the alloy being a pseudo binary semiconductor compound of the first type of atom and of the third atoms, the alloy having a bond length between the first type of atoms and the third atoms less than the bond lengths of the host material between the first and second types of atoms, the host semiconductor material and the alloy semiconductor compound being different III-V compounds, the bond length of the alloyed compound being less than the bond length of the host compound, the host compound being AlP and the alloyed compound being selected from the group consisting essentially of BP and AlN, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

76. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InSb and the formed host and alloyed semiconductor being selected from the group consisting essentially of $InSb_{1-y}P_y$ and of $InSb_{1-y}N_y$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

77. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of InP and the semiconductor formed by the host and alloyed semiconductor being $InP_{1-y}N_y$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

78. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of AlP and the formed host and alloyed semiconductor being $AlP_{1-y}N_y$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

79. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of GaP and the formed host and alloyed semiconductor being $GaP_{1-y}N_y$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

80. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$, the host semiconductor consisting essentially of HgTe and the formed host and alloyed semiconductor being selected from the group consisting essentially of $HgTe_{1-y}Se_y$ and $HgTe_{1-y}S_y$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

81. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of InP and the semiconductor formed by the host and alloyed semiconductors being formed of the group consisting essentially of $In_{1-x}Ga_xP$, $In_{1-x}Al_xP$ and $In_{1-x}B_xP$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

82. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of InP and the semiconductor formed by the host and alloyed semiconductors being formed from the group consisting essentially of $In_{1-x}B_xP$, $In_{1-x}Al_xP$ and $In_{1-x}Ga_xP$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

83. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of AlP and the semiconductor formed by the host and alloyed semiconductors being $Al_{1-x}B_xP$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

84. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor being GaAs and the semiconductor formed by the host and alloyed semiconductors being $Ga_{1-x}B_xAs$, an epitaxial layer on said large surface area of the host material, the epitaxial layer being formed of the same host semiconductor and alloyed in the same manner by the same alloy atoms as the bulk substrate to form a region having a large surface and volume virturally free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

85. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor material being a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material, the host and alloyed semiconductors forming a semiconductor compound of the form $M_{1-x}Q_xR$, where M and Q are respectively anions and cations selected from the semiconductors of Groups II and III and R is selected from the semiconductors of Groups VI and V, respectively, Q is an element having an anion, and $0.01<x<0.3$, the host semiconductor consisting essentially of HgTe and the semiconductor formed by the host and alloyed semiconductors being formed of the group consisting essentially of $Hg_{1-x}Zn_xTe$ and $Hg_{1-x}Mg_xTe$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

86. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate disclocations over a large surface area and volume of the host material, the host semiconductor material being a pseudo binary compound of first and second types of atoms, bonds between the first and second types of atoms having the known bond length, the alloyed atoms including third and fourth atoms to form further and additional bonds with the one atom type of the host, the further bonds having lengths that are shorter than the known host bond lengths, the additional bonds having lengths that are shorter than lengths of the further bonds, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said device having semiconductor regions forming junctions with the epitaxial layer.

87. The circuit structure of claim 86 wherein the host is $Ga_{1-x}In_xSb$ and the formed and alloyed compound is selected from the group comprising $Ga_{1-x}In_xSb_{1-y}N_y$ and $Ga_{1-x}In_xSb_{1-y}P_y$, where $y>x$, $x+y<0.3$ and $x>0$.

88. The circuit structure of claim 86 wherein the host is $Hg_{1-x}Cd_xTe$ and the formed and alloyed compound is selected from the group comprising $Hg_{1-x}Cd_xTe_{1-y}S_y$ and $Hg_{1-x}Cd_xTe_{1-y}Se_y$.

89. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor consisting essentially of HgTe and the alloy semiconductor is Zn and the substrate formed by the host and alloy consisting essentially of $Hg_{1-x}Zn_xTe$, where $0.01 \leq x < 0.3$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

90. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host being a pseudo binary crystal consisting of three elements of the form $M_{1-x}A_xQ$ that is alloyed with R to form the alloyed compound $M_{1-z}A_xQ_{1-y}R_y$, where M and Q are elements in equally displaced and oppositely directed first and second columns of the periodic chart relative to the fourth column, A is in said first column and R is in said second column, $y>x$, $x>0$, and $x+y<0.3$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

91. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material the host being a pseudo binary crystal consisting of three elements of the form $M_{1-x}A_xQ$, the pseudo binary crystal being alloyed with R to form the alloyed compound $M_{1-x-y}A_xR_yQ$, where M and Q are semiconductors in equally displaced and oppositely directed first and second columns of the periodic chart relative to the fourth column, A and R are in the first column, $y>x$, $x>0$, and $x+y<0.3$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at-least several active semiconductor devices, and at least several semiconductor devices located on said epitaxial layer, each of said devices having semiconductor regions forming junctions with the epitaxial layer.

92. The circuit structure of claim 91 wherein the host is $Ga_{1-x}In_xSb$ and the formed and alloyed compound comprises $Ga_{1-x-y}In_xB_ySb$, where $y>x$, $x+y<0.3$ and $x>0$.

93. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, the host semiconductor consisting essentially of HgTe and the alloy semiconductor is Zn and the substrate formed by the host and alloy consisting essentially of $Hg_{1-x}Zn_xTe$, where $0.01 \leq x < 0.3$, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

94. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the host being $Hg_{1-x}Cd_xTe$ and the formed and alloyed compound being $Hg_{1-x-y}Cd_xZn_yTe$, where $y>x$, $x>0$, and $x+y<0.3$, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices, and at least several semiconductor devices located on said epitaxial layer, each of said devices having semiconductor regions forming junctions with the epitaxial layer.

95. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area and volume of the host material so that there is at least one atomic percent of the bonded alloy atoms in the bulk substrate, the large surface and volume of the host semiconductor material being sufficient to accommodate at least several active semiconductor devices, and at least several active semiconductor devices located on said large surface area and volume of the host semiconductor material, each of said devices having semiconductor regions forming junctions with the host material.

96. The circuit structure of claim 95 wherein the host semiconductor material is a Group IV pseudo elemental semiconductor and the alloyed atoms are a Group IV semiconductor element different from the host element.

97. The circuit structure of claim 96 wherein the pseudo elemental semiconductor is selected from the group consisting of Si, Ge and Sn and the alloyed atoms are selected from the group consisting of C and Si.

98. The circuit structure of claim 97 wherein the host pseudo elemental semiconductor is selected from the group consisting of $Ge_{1-x}Sn_x$ and $Si_{1-x}Ge_x$, where $0<x<1$.

99. The circuit structure of claim 95 wherein the host semiconductor material is a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material.

100. The circuit structure of claim 99 wherein the alloy is a pseudo binary semiconductor compound of the first type of atom and of the third atoms, the alloy having a bond length between the first type of atoms and the third atoms less than the bond lengths of the host material between the first and second types of atoms.

101. The circuit structure of claim 100 wherein the host semiconductor material and the alloy semiconductor compound are different III-V compounds, the bond length of the alloyed compound being less than the bond length of the host compound.

102. The circuit structure of claim 99 wherein the host and alloyed semiconductors form a semiconductor compound of the form $MQ_{1-y}R_y$, where M is selected from the semiconductors of Groups II and III and Q and R are selected from the semiconductors of Groups VI and V, respectively, R is an element having a cation, and $0.01<y<0.3$.

103. The circuit structure of claim 102 wherein the host semiconductor consists essentially of GaAs and the formed host and alloyed semiconductor is selected from the group consisting essentially of $GaAs_{1-y}P_y$ and $GaAs_{1-y}N_y$.

104. The circuit structure of claim 99 wherein the host and alloyed semiconductors form a semiconductor compound of the form $M_{1-x}Q_xR$, where M and Q are cations selected from the semiconductors of Group II and III and R is an anion selected from the semiconductors of Groups VI and V, respectively, and $0.01 < x < 0.3$.

105. A semiconductor circuit structure comprising a bulk substrate formed of a tetrahedral structured crystalline host semiconductor material consisting essentially of bonded host atoms bonded at least by covalent and metallic forces, the bonded atoms of the host semiconductor material nearest to each other having a known bond length, the host semiconductor material being alloyed with alloy atoms that replace some of the atoms of the host semiconductor material so that the alloy atoms and host atoms are bonded at least by covalent and metallic forces, the alloy atoms having a bond length with the nearest neighboring host atoms that is less than the known host bond length, the number of bonded alloy atoms being small compared to the number of bonded host atoms so as not to substantially affect electron conduction properties of the host material, the number of bonded alloy atoms being sufficient to virtually eliminate dislocations over a large surface area of the host material so that there is at least one atomic percent of the bonded alloy atoms in the bulk substrate, an epitaxial layer on said large surface area of the host material, the epitaxial layer being formed of the same host semiconductor and alloyed in the same manner by the same alloy atoms as the bulk substrate to form a region having a large surface and volume virtually free of dislocations, the large surface and volume of the epitaxial layer being sufficient to accommodate at least several active semiconductor devices and at least several active semiconductor devices located on said epitaxial layer, each of said devices having semiconductor regions forming junctions with the epitaxial layer.

106. The circuit structure of claim 105 wherein the host semiconductor material is a Group IV pseudo elemental semiconductor and the alloyed atoms are a Group IV semiconductor element different from the host element.

107. The circuit structure of claim 106 wherein the pseudo elemental semiconductor is selected from the group consisting of Si, Ge and Sn and the alloyed atoms are selected from the group consisting of C and Si.

108. The circuit structure of claim 107 wherein the host pseudo elemental semiconductor is selected from the group consisting of $Ge_{1-x}Sn_x$ and $Si_{1-x}Ge_x$, where $0 < x < 1$.

109. The circuit structure of claim 105 wherein the host semiconductor material is a pseudo binary compound of first and second types of atoms between which subsist the host material bonds having the known bond length, the alloy including third atoms of the second atom type that replace some of the atoms of the second type to form bonds with the first types of atoms having the bond length that is less than bond lengths of the atoms of the host material.

110. The circuit structure of claim 109 wherein the alloy is a pseudo binary semiconductor compound of the first type of atom and of the third atoms, the alloy having a bond length between the first type of atoms and the third atoms less than the bond lengths of the host material between the first and second types of atoms.

111. The circuit structure of claim 110 wherein the host semiconductor material and the alloy semiconductor compound are different III-V compounds, the bond length of the alloyed compound being less than the bond length of the host compound.

112. The circuit structure of claim 109 wherein the host and alloyed semiconductors form a semiconductor compound of the form $MQ_{1-y}R_y$, where M is selected from the semiconductors of Groups II and III and Q and R are selected from the semiconductors of Groups VI and V, respectively, R is an element having a cation, and $0.01 < y < 0.3$.

113. The circuit structure of claim 112 wherein the host semiconductor consists essentially of GaAs and the formed host and alloyed semiconductor is selected from the group consisting essentially of $GaAs_{1-y}P_y$ and $GaAs_{1-y}N_y$.

114. The circuit structure of claim 109 wherein the host and alloyed semiconductors form a semiconductor compound of the form $M_{1-x}Q_xR$, where M and Q are cations selected from the semiconductors of Group II and III and R is selected from the semiconductors of Groups VI and V, respectively, and $0.01 < x < 0.3$.

* * * * *